United States Patent
Patil et al.

(10) Patent No.: US 10,083,600 B1
(45) Date of Patent: Sep. 25, 2018

(54) MOBILE COMPUTING DEVICE WIRELESS DATA TRANSMISSION

(71) Applicant: Bose Corporation, Framingham, MA (US)

(72) Inventors: Naganagouda Patil, Ashland, MA (US); Stephen McDonald, Northborough, MA (US)

(73) Assignee: Bose Corporation, Framingham, MA (US)

( * ) Notice: Subject to any disclaimer, the term of this patent is extended or adjusted under 35 U.S.C. 154(b) by 0 days.

(21) Appl. No.: 15/649,816

(22) Filed: Jul. 14, 2017

(51) Int. Cl.
| H04R 5/02 | (2006.01) |
| G08C 17/00 | (2006.01) |
| H04B 10/114 | (2013.01) |
| H04B 5/00 | (2006.01) |
| G06F 3/16 | (2006.01) |

(52) U.S. Cl.
CPC ............ *G08C 17/00* (2013.01); *G06F 3/162* (2013.01); *H04B 5/0006* (2013.01); *H04B 10/114* (2013.01); *H04R 2420/07* (2013.01)

(58) Field of Classification Search
CPC ....... G08C 17/00; G06F 3/162; H04B 5/0006; H04B 10/114; H04R 2420/07
USPC .......................................................... 381/311
See application file for complete search history.

(56) References Cited

U.S. PATENT DOCUMENTS

| 2004/0255760 | A1* | 12/2004 | Cheng | G10H 1/0041 84/615 |
| 2005/0181826 | A1* | 8/2005 | Yueh | G06F 1/1626 455/556.2 |
| 2005/0268319 | A1* | 12/2005 | Brady, Jr. | B64D 11/0015 725/76 |
| 2006/0075347 | A1* | 4/2006 | Rehm | G06F 3/16 715/727 |
| 2008/0039017 | A1* | 2/2008 | Kim | H04M 1/6066 455/41.2 |
| 2010/0124947 | A1* | 5/2010 | Sano | H04M 1/6058 455/567 |
| 2014/0327826 | A1* | 11/2014 | Huang | H04N 5/607 348/485 |
| 2015/0326970 | A1* | 11/2015 | Miske | H04R 1/1041 381/123 |
| 2016/0173160 | A1* | 6/2016 | Gronewoller | H04B 1/3888 455/575.8 |
| 2017/0201844 | A1* | 7/2017 | Smith | H04S 7/301 |

OTHER PUBLICATIONS

LID, Android Phone, p. 1, 20151.*

* cited by examiner

*Primary Examiner* — William A Jerez Lora

(74) *Attorney, Agent, or Firm* — Brian M. Dingman; Dingman IP Law, PC

(57) ABSTRACT

A mobile computing device that is configured to wirelessly transmit audio data to an audio sink device. The mobile computing device has a wired audio input connector that is constructed and arranged to accept input audio data from an audio data source that is directly electrically coupled to the wired audio input connector. The mobile computing device includes circuitry that is configured to route the input audio data to the audio sink by wireless transmission. When input audio data is available from the audio input connector, the circuitry is configured to determine whether to route the audio input data to the audio sink device.

22 Claims, 2 Drawing Sheets

MOBILE COMPUTING DEVICE WIRELESS DATA TRANSMISSION

BACKGROUND

This disclosure relates to wirelessly transmitting audio data from a source device to an audio sink.

Wireless headphones, and other types of audio sinks, do not always include an audio input jack. In such cases, an additional device may be needed in order to wirelessly transmit to the audio sink, audio data from a wired audio source, such as the entertainment systems of many commercial airplanes.

SUMMARY

All examples and features mentioned below can be combined in any technically possible way.

In one aspect, a mobile computing device that is configured to wirelessly transmit audio data to an audio sink device, wherein the mobile computing device comprises a wired audio input connector that is constructed and arranged to accept input audio data from an audio data source that is directly electrically coupled to the wired audio input connector, includes circuitry that is configured to route the input audio data to the audio sink by wireless transmission. When input audio data is available from the audio input connector the circuitry is configured to determine whether to route the audio input data to the audio sink device.

Embodiments may include one of the following features, or any combination thereof. The audio sink may be headphones, e.g., wireless headphones. The mobile computing device may be a smartphone. The circuitry that is configured to route the input audio data to the audio sink by wireless transmission may comprise a processor.

Embodiments may include one of the following features, or any combination thereof. The audio data source may be directly electrically coupled to the wired audio input connector by a cable with two ends, wherein the cable comprises a male electrical connector at each of the two ends. A first male electrical connector may comprise a plug that is constructed and arranged to be coupled to an audio output jack of an airplane entertainment system. A second male electrical connector may comprise a connector that is constructed and arranged to be coupled to a headphone jack of the mobile computing device. The headphone jack may comprise at least one of a 3.5 mm jack and a lightning connector and a USB type-C connector.

Embodiments may include one of the following features, or any combination thereof. The circuitry may be further configured to detect when the audio data source is directly electrically coupled to the wired audio input connector. The circuitry may be further configured to automatically route the input audio data to the audio sink by wireless transmission when the circuitry detects that the audio data source is directly electrically coupled to the wired audio input connector. The mobile computing device may further include a user interface (UI) that presents a user with an option to select to wirelessly transmit to the audio sink either audio from the mobile computing device or input audio data received from an audio data source.

Embodiments may include one of the following features, or any combination thereof. The circuitry may be further configured to apply an audio processing technique to the input audio data. The audio processing technique may comprise speech enhancement. The speech enhancement may be accomplished using a speech-band filter. The audio processing technique may comprise active noise compensation. The active noise compensation may use at least one microphone of the mobile computing device to adjust audio volume based on the environmental noise. The audio processing technique may comprise audio equalization.

Embodiments may include one of the following features, or any combination thereof. The circuitry may be further configured to mix audio from the mobile computing device and the input audio data into a mixed audio signal that is wirelessly transmitted to the audio sink device. The circuitry may be further configured to wirelessly transmit the audio data simultaneously to more than one audio sink device.

In another aspect, a smartphone that is configured to wirelessly transmit audio data to headphones, wherein the smartphone comprises a wired audio input connector that is constructed and arranged to accept input audio data from an audio data source that is directly electrically coupled to the wired audio input connector by a cable with two ends, includes a processor that is configured to detect when the audio data source is directly electrically coupled to the wired audio input connector, and automatically route at least some of the input audio data to the headphones by wireless transmission when the processor detects that the audio data source is directly electrically coupled to the wired audio input connector.

Embodiments may include one of the above and/or below features, or any combination thereof. The processor may be further configured to apply an audio processing technique to the input audio data. The processor may be further configured to mix audio from the smartphone and the input audio data into a mixed audio signal that is wirelessly transmitted to the headphones.

In another aspect, an audio system includes a mobile computing device that is configured to wirelessly transmit audio data to headphones, wherein the mobile computing device comprises a wired audio input connector and a user interface (UI), and a cable with two ends, with one end adapted to be coupled to the wired audio input connector of the mobile computing device. The wired audio input connector is constructed and arranged to accept input audio data from an audio data source that is directly electrically coupled to the wired audio input connector by the cable. The mobile computing device further comprises a processor that is configured to detect when the audio data source is directly electrically coupled to the wired audio input connector by the cable, present via the UI an option for a user to select to wirelessly transmit to the audio sink either audio from the mobile computing device or input audio data received from an audio data source, and automatically route at least some of the input audio data to the headphones by wireless transmission in response to the user selecting to receive audio from the audio data source.

DETAILED DESCRIPTION

Wireless headphones, and other types of audio sinks, do not always include an audio input jack. However, there are certain audio data sources that do not have wireless transmission capabilities and so cannot be wirelessly coupled to wireless headphones. Some audio data sources only have a hard-wired audio output (e.g., an audio output jack), including, without limitation, the entertainment systems of many commercial airplanes, and older audio systems (e.g., MP3 players). In order to use wireless headphones to listen to audio data from these types of sources, a user can employ a separate, battery-operated, dongle with an audio input jack and a Bluetooth® transmitter. However, this requires the person to carry an additional device, and keep it charged. It also likely requires the person to manage pairing between multiple wireless devices.

Mobile computing devices such as smartphones, tablets, and the like, often include an input jack that is adapted to accept input audio data. The input jack can be an audio jack (e.g., a 3.5 mm audio jack), or a lightning connector (for iOS devices), or a USB type-C connector (for Android devices) as non-limiting examples. Most such mobile devices also support Bluetooth® for wireless audio transmission. Such mobile devices can be enabled to route audio data received via the input jack to an audio sink by wireless (e.g., Bluetooth®) transmission. The routing can be accomplished in a manner that is compatible with the particular mobile device. In many cases, the routing can be accomplished using an application that is designed to be run on a processor of the mobile device. Routing can also be accomplished with an electronic relay switch that is adapted to route audio data received via the input jack, to the Bluetooth® (or other wireless) transmission module.

Figure 1:
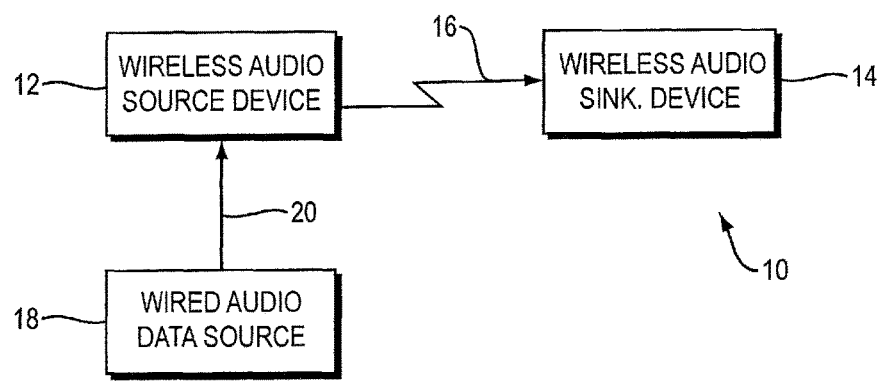
FIG. 1 is a schematic diagram of an audio system.

FIG. 1 is a schematic diagram of an audio system 10. System 10 includes an audio source device 12 that has wireless transmission capabilities. Audio source device 12 is typically but not necessarily a mobile computing device, such as a smartphone or a tablet. Audio data source 18 may be directly electrically coupled to source device 12 by cable 20. Audio data source 18 is typically a type of audio data source that does not have wireless data transmission capabilities, such as an airplane entertainment system or an older audio system, as described above. However, source 18 could have wireless capabilities, but it also needs to have a physical data output device such as an audio jack, that allows data source 18 to be directly electrically coupled to source device 12 in a manner that allows audio data to be transmitted from source 18 to device 12 over cable 20. Device 12 has wireless data transmission capabilities 16, and so is able to wirelessly transmit audio data to wireless audio sink device 14. Device 14 needs to have the capability to receive audio data that is transmitted wirelessly. However, device 14 need not be fully wireless. That is, device 14 could have (and often times, does have) that ability to accept data over hard-wired connections. The present disclosure takes advantage of the wireless capabilities of both device 12 and device 14, regardless of other transmission/reception capabilities. For example, device 12 and/or device 14 may have an audio jack or other means by which to send/receive data over a wired connection. In the present disclosure, devices 12 and 14 use wireless capabilities to communicate audio data.

Source device 12 includes circuitry that is configured to route to audio sink 14 by wireless transmission 16, audio data received over cable 20. This circuitry can be accomplished in any manner now known, or developed in the future. For source devices with internal audio data processing capabilities, the circuitry can be a properly programmed processor that is enabled to route data received over cable 20 to device 14. As one non-limiting example, a smartphone or tablet mobile computing/source device can be configured to run an application program (an "app") that is enabled to wirelessly route to sink device 14 audio data received over cable 20. Routing of audio data received by device 12, for wireless transmission to device 14, is further explained below.

Wireless transmission 16 can be accomplished in any manner now known, or developed in the future. While Bluetooth® is used as an example of the wireless connection, other communication protocols may also be used. Some examples include Bluetooth® Low Energy (BLE), Near Field Communications (NFC), IEEE 802.11, Radio Frequency (RF) communications, infrared (IR) communications, or other local area network (LAN) or personal area network (PAN) protocols, each of which is well-known in the field and so is not described further herein.

System 10 thus allows a user with wireless audio sink device 14 to receive audio data from wired audio data source 18, in situations where device 14 is not, or cannot be, directly, electrically coupled to the audio data output of data source 18. Typically, but not necessarily, device 14 is an audio output device such as headphones or a portable speaker, that does not have the wired data input hardware (such as an input jack) that is compatible with any wired data output of source 18. Device 12 is used as an intermediate device that can be directly coupled to device 18 with a wire or cable, and can then wirelessly transmit received audio data to device 14.

Figure 2:
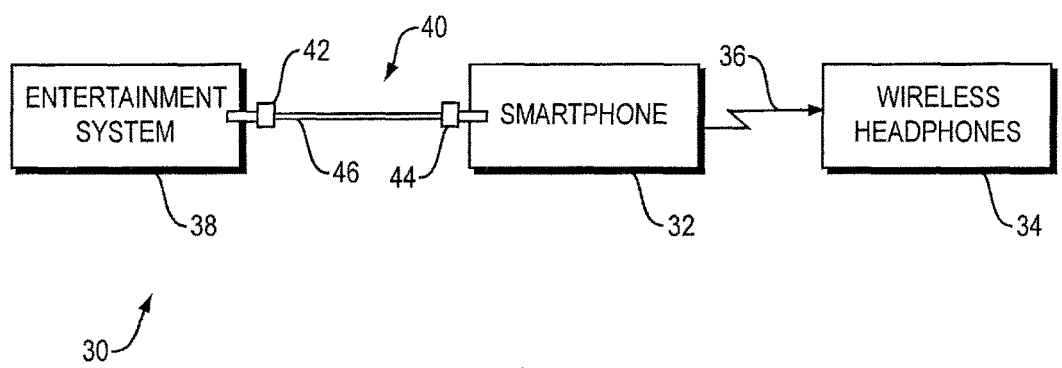
FIG. 2 is a schematic diagram of an audio system that is adapted to wirelessly couple an airplane entertainment system to wireless headphones or other audio sink devices.

FIG. 2 is a schematic diagram of an audio system 30 that is adapted to wirelessly couple audio from an airplane entertainment system 38 to wireless headphones 34. In many cases, airplane entertainment systems have an audio output jack that can accept a headphone audio plug. However, if the headphones do not have a plug that fits into the jack, or are otherwise incompatible with the output hardware of entertainment system 38 and so are not able to directly receive audio data from entertainment system 38, smartphone 32 (with the proper added capabilities, further described below) can be used to wirelessly route the audio data to headphones 34. Note that device 32 does not need to be a smartphone, but could be another type of device with the necessary processing capabilities, the necessary input connector, and the necessary wireless transmission capabilities. Such devices include tablets, portable computing devices, and other types of devices known in the art. Connector 40, with plugs 42 and 44 and cable 46, is plugged into audio jacks of both entertainment system 38 and smartphone 32, so that audio data can be received by smartphone 32. Plug 42 and plug 44 can be selected based on the particular entertainment system (or other audio data source), and the particular smartphone (or other device). For example, if smartphone is an iOS device, plug 44 could be a lightning connector, of a type well known in the art. As another example, for an Android device plug 44 could be a USB connector, such as a USB type-C connector. Smartphone 32 is modified such that it is able to wirelessly transmit this audio data to headphones 34 over wireless connection 36. In one example, smartphone 32 is configured to run an app that is enabled to wirelessly route to headphones 34 audio data received over connector 40.

Smartphone 32, of course, can also transmit its own audio data, or audio data from the cloud, to headphones 34. Thus, smartphone 32 acts as both a stand-alone audio source, and a conduit for audio data from entertainment system 38 (or another source of audio data). Smartphone 32 can be enabled to allow the user to select which source to transmit to headphones 34. Also, smartphone 32 can be enabled to mix its stand-alone audio data (e.g., audio data stored locally on the smartphone 32 or audio data accessed from a remote database, such as the cloud) with audio data received from entertainment system 38. Such mixing could be useful, for example, in situations in which a user desires to hear audio from entertainment system 38, while not interrupting audio from smartphone 32. For example, if important announcements are being made to air passengers via entertainment system 38, the user may desire to hear them, while also maintaining the current audio stream. Thus, the smartphone 32 could continue to play the user's current audio stream, perhaps at a reduced volume, while also routing audio from system 38, in the case where an in-flight announcement is being made. As another alternative, smartphone 32 could automatically pause the user's current audio stream while the audio from entertainment system 38 is played, and then automatically resume the user's current audio stream when the in-flight announcement is complete.

Figure 3:
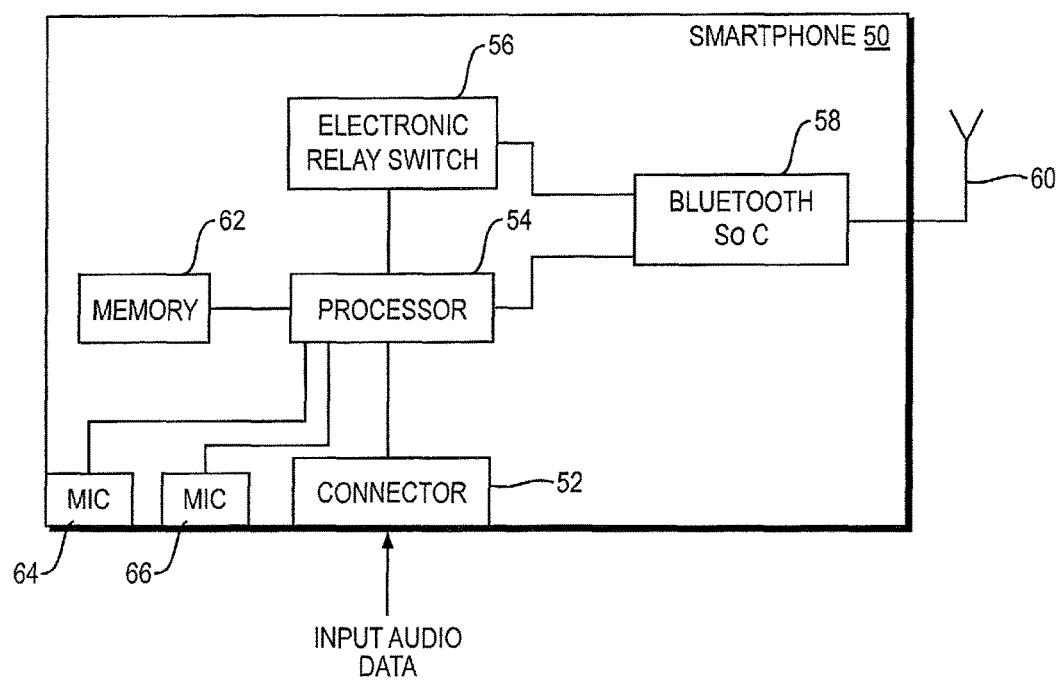
FIG. 3 is a schematic diagram of a smartphone that is configured to wirelessly transmit input audio data to wireless headphones or other audio sink devices.

One non-limiting example of modifications to a traditional smartphone (or other type of mobile computing device as described elsewhere herein) that can enable the above-described capabilities, is shown in FIG. 3, which is a schematic diagram of a smartphone 50 that is configured to wirelessly transmit input audio data to wireless headphones or other audio sink devices. Smartphone 50 comprises electrical connector 52 that is able to be directly, electrically coupled to an output of an audio data source (not shown). Received audio data is provided to processor 54. Processor 54 is programmed to route the received audio data to Bluetooth System on a Chip (SoC) 58, which uses antenna 60 to wirelessly transmit audio data to an audio sink (not shown). Bluetooth SoC is only one of many types of means by which smartphones and other portable computing devices are provided with the capability to wirelessly transmit audio data. This disclosure is not limited to Bluetooth, or a Bluetooth SoC, and contemplates any means by which devices can wirelessly transmit audio data. Local audio data, from device memory 62, as well as audio data accessed through the cloud, can also be wirelessly transmitted, as described above.

Smartphone 50 can be configured to automatically detect when an audio data source is directly, electrically coupled to wired audio input connector 52. The mobile app running on smartphone 50 is configured to be notified by the operating system running on processor 54. When input data is detected, the data can be automatically routed to the Bluetooth SoC 58, or the user can be provided the ability to select one or both of local audio data from memory 62 (or audio data accessed through the cloud) and input audio data from the audio data source, for wireless transmission. Such selection could be made via the smartphone user interface, not shown. For example, an application that is designed to be run on a processor of the smartphone (e.g., processor 54) could, upon detection of an audio data source being electrically coupled to the wired audio input connector 52, display a user interface asking the user if the user would like to listen to the audio from the audio data source (e.g., the airplane entertainment system). If the user affirmatively selects such an option, the audio from the audio data source could be routed to the Bluetooth SoC 58 for wireless transmission to the audio sink. If the user declines such an option, the audio from the audio data source would not be routed to the Bluetooth SoC 58 and would not be wirelessly transmitted to the audio sink.

The mobile computing device may be configured to apply desired audio data prioritization schemes. For example, there may be instances in which the data received via the audio jack is prioritized over other sources, or at a minimum is mixed with another source that is already being played, such as in the case of an in-flight announcement which generally should be prioritized. On the other hand, local data (e.g., data originating from the mobile device, or data coming into the mobile device from another source such as a telephone call or data received from the cloud) can be prioritized. For example, incoming telephone calls might be prioritized over data being received over the input audio jack.

The mobile app running on processor 54 can be further enabled (by proper programming) to apply further audio processing to the input audio data, before the data is wirelessly transmitted. One example is audio equalization, which is well understood in the art and so is not further described herein. Different audio equalization could be applied depending on the type of audio being played (e.g., music vs. speech, different types of music, etc.). Another example of audio processing is speech enhancement, which can be used to increase the clarity or intelligibility of input speech signals. This feature may be particularly useful in airplane cabins, where crew announcements provided over the entertainment system, for persons wearing headphones, can be noisy and hard to hear. Speech enhancement can be accomplished with a speech-band filter enabled by processor 54, that operates to pass frequencies in the voice band while removing lower frequency content, or in other manners know in the art.

The mobile app running on smartphone 50 can also be enabled to accomplish active noise reduction (ANR) on input audio data, using processor 54 and one or more microphones already present in smartphone 50 (microphones 64 and 66 shown). For example, the one or more microphones could detect external noise in the environment, and apply ANR techniques to substantially cancel or reduce that detected noise. ANR is another example of audio processing. ANR accomplished by a processor and microphones of a portable computing device is known in the art and so is not further described herein. As another non-limiting example, the mobile app can also be configured to accomplish active noise compensation, which automatically adjusts sound volume based on the level of external noise. Active noise compensation is known in the art and so is not further described herein.

Elements of figures are shown and described as discrete elements in a block diagram. These may be implemented as one or more of analog circuitry or digital circuitry. Alternatively, or additionally, they may be implemented with one or more microprocessors executing software instructions. The software instructions can include digital signal processing instructions. Operations may be performed by analog circuitry or by a microprocessor executing software that performs the equivalent of the analog operation. Signal lines may be implemented as discrete analog or digital signal lines, as a discrete digital signal line with appropriate signal processing that is able to process separate signals, and/or as elements of a wireless communication system.

When processes are represented or implied in the block diagram, the steps may be performed by one element or a plurality of elements. The steps may be performed together or at different times. The elements that perform the activities may be physically the same or proximate one another, or may be physically separate. One element may perform the actions of more than one block. Audio signals may be encoded or not, and may be transmitted in either digital or analog form. Conventional audio signal processing equipment and operations are in some cases omitted from the drawing.

A number of implementations have been described. Nevertheless, it will be understood that additional modifications may be made without departing from the scope of the inventive concepts described herein, and, accordingly, other embodiments are within the scope of the following claims.

What is claimed is:

1. A mobile computing device that is configured to wirelessly transmit audio data to a separate audio sink device, wherein the audio sink device is configured to wirelessly receive and play audio data, and wherein the mobile computing device comprises a wired audio input connector that is constructed and arranged to accept input audio data from a separate audio data source that is electrically coupled to the wired audio input connector, the mobile computing device comprising:

circuitry that is configured to route the input audio data to the audio sink device by wireless transmission;

wherein when input audio data is available from the wired audio input connector, the circuitry is configured to determine whether to route the audio input data to the audio sink device; and a user interface (UI) that presents a user with an option to select to wirelessly transmit to the audio sink device either audio from the mobile computing device or input audio data received from an audio data source, to allow the user to play audio from either the mobile computing device or from the audio data source.

2. The mobile computing device of claim 1, wherein the audio sink device comprises headphones.

3. The mobile computing device of claim 1, wherein the mobile computing device comprises a smartphone.

4. The mobile computing device of claim 1, wherein the circuitry that is configured to route the input audio data to the audio sink device by wireless transmission comprises a processor.

5. The mobile computing device of claim 1, wherein the audio data source is electrically coupled to the wired audio input connector by a cable with two ends, wherein the cable comprises a male electrical connector at each of the two ends.

6. The mobile computing device of claim 5, wherein a first male electrical connector comprises a plug that is constructed and arranged to be coupled to an audio output jack of an airplane entertainment system.

7. The mobile computing device of claim 6, wherein a second male electrical connector comprises a connector that is constructed and arranged to be coupled to a headphone jack of the mobile computing device.

8. The mobile computing device of claim 7, wherein the headphone jack comprises at least one of: a 3.5 mm jack and a lightning connector and a USB type-C connector.

9. The mobile computing device of claim 1, wherein the circuitry is further configured to detect when the audio data source is electrically coupled to the wired audio input connector.

10. The mobile computing device of claim 9, wherein the circuitry is further configured to automatically route the input audio data to the audio sink device by wireless transmission when the circuitry detects that the audio data source is electrically coupled to the wired audio input connector.

11. The mobile computing device of claim 1, wherein the circuitry is further configured to apply an audio processing technique to the input audio data.

12. The mobile computing device of claim 11, wherein the audio processing technique comprises speech enhancement.

13. The mobile computing device of claim 12, wherein speech enhancement is accomplished using a speech-band filter.

14. The mobile computing device of claim 11, wherein the audio processing technique comprises active noise compensation.

15. The mobile computing device of claim 14, wherein the active noise compensation uses at least one microphone of the mobile computing device to adjust audio volume based on ante environmental noise.

16. The mobile computing device of claim 11, wherein the audio processing technique comprises audio equalization.

17. The mobile computing device of claim 1, wherein the circuitry is further configured to mix audio from the mobile computing device and the input audio data into a mixed audio signal that is wirelessly transmitted to the audio sink device.

18. The mobile computing device of claim 1, wherein the circuitry is further configured to wirelessly transmit the audio data simultaneously to more than one audio sink device.

19. A smartphone that is configured to wirelessly transmit audio data to headphones, wherein the smartphone comprises a wired audio input connector that is constructed and arranged to accept input audio data from an audio data source that is electrically coupled to the wired audio input connector by a cable with two ends, the smartphone comprising:

a processor that is configured to:

detect when the audio data source is electrically coupled to the wired audio input connector; and automatically route at least some of the input audio data to the headphones by wireless transmission when the processor detects that the audio data source is electrically coupled to the wired audio input connector; and a user interface (UI) that presents a user with an option to select to wirelessly transmit to the headphones either audio from the smartphone or input audio data received from an audio data source, to allow the user to play audio from either the smartphone or from the audio data source.

20. The smartphone of claim 19 wherein the processor is further configured to apply an audio processing technique to the input audio data.

21. The smartphone of claim 19 wherein the processor is further configured to mix audio from the smartphone and the input audio data into a mixed audio signal that is wirelessly transmitted to the headphones.

22. An audio system, comprising:

a mobile computing device that is configured to wirelessly transmit audio data to headphones, wherein the mobile computing device comprises a wired audio input connector and a user interface (UI);

a cable with two ends, with one end adapted to be coupled to the wired audio input connector of the mobile computing device;

wherein the wired audio input connector is constructed and arranged to accept input audio data from an audio data source that is electrically coupled to the wired audio input connector by the cable; and wherein the mobile computing device further comprises a processor that is configured to:

detect when the audio data source is electrically coupled to the wired audio input connector by the cable;

present via the UI an option for a user to select to wirelessly transmit to the headphones either audio from the mobile computing device or input audio data received from an audio data source, to allow the user to play audio from either the mobile computing device or from the audio data source; and;

automatically route at least some of the input audio data to the headphones by wireless transmission in response to the user selecting to receive audio from the audio data source.

\* \* \* \* \*